United States Patent
Ahmed et al.

(10) Patent No.: US 7,939,440 B2
(45) Date of Patent: May 10, 2011

(54) JUNCTION LEAKAGE SUPPRESSION IN MEMORY DEVICES

(75) Inventors: Shibly S. Ahmed, San Jose, CA (US);
Jun Kang, San Jose, CA (US);
Hsiao-Han Thio, Santa Clara, CA (US);
Imran Khan, Santa Clara, CA (US);
Dong-Hyuk Ju, Cupertino, CA (US);
Chuan Lin, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 128 days.

(21) Appl. No.: 11/152,375

(22) Filed: Jun. 15, 2005

(65) Prior Publication Data

US 2007/0052002 A1 Mar. 8, 2007

(51) Int. Cl.
*H01L 21/425* (2006.01)
*H01L 21/44* (2006.01)
(52) U.S. Cl. .. 438/529; 438/527; 438/682; 257/E21.619
(58) Field of Classification Search ................. 438/527, 438/682, 306, 521, 529; 257/E21.619
See application file for complete search history.

(56) References Cited

U.S. PATENT DOCUMENTS

| | | | |
|---|---|---|---|
| 5,340,760 A | 8/1994 | Komori et al. | |
| 5,817,564 A * | 10/1998 | Church et al. | 438/307 |
| 6,017,796 A | 1/2000 | Chen et al. | |
| 6,249,021 B1 | 6/2001 | Furuhata | |
| 6,297,098 B1 * | 10/2001 | Lin et al. | 438/264 |
| 6,746,906 B2 * | 6/2004 | Rabkin et al. | 438/199 |
| 6,806,157 B2 * | 10/2004 | Yang et al. | 438/306 |
| 2002/0022322 A1 | 2/2002 | Liu et al. | |
| 2002/0053700 A1 * | 5/2002 | Ballantine et al. | 257/344 |
| 2002/0055230 A1 * | 5/2002 | Chang | 438/258 |
| 2004/0092123 A1 * | 5/2004 | Ikeda | 438/719 |
| 2004/0191988 A1 * | 9/2004 | Sandhu et al. | 438/257 |
| 2005/0112875 A1 * | 5/2005 | Lander et al. | 438/682 |
| 2006/0040462 A1 * | 2/2006 | Wu et al. | 438/424 |

OTHER PUBLICATIONS

PCT Search Report and Written Opinion, Dec. 6, 2006.

* cited by examiner

*Primary Examiner* — David S Blum
*Assistant Examiner* — Daniel Luke
(74) *Attorney, Agent, or Firm* — Harrity & Harrity, LLP

(57) ABSTRACT

A memory device includes a substrate and source and drain regions formed in the substrate. The source and drain regions include both phosphorous and arsenic and the phosphorous may be implanted prior to the arsenic. The memory device also includes a first dielectric layer formed over the substrate and a charge storage element formed over the first dielectric layer. The memory device may further include a second dielectric layer formed over the charge storage element and a control gate formed over the second dielectric layer.

18 Claims, 12 Drawing Sheets

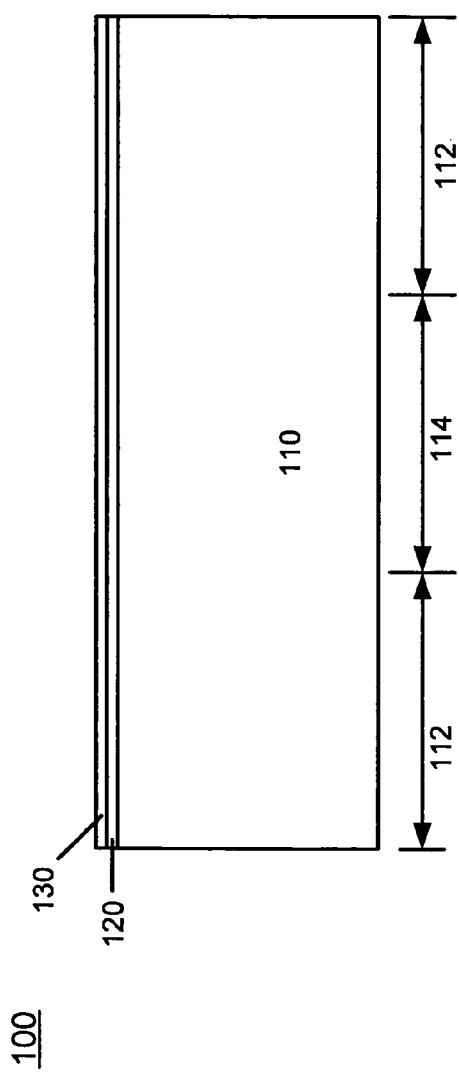
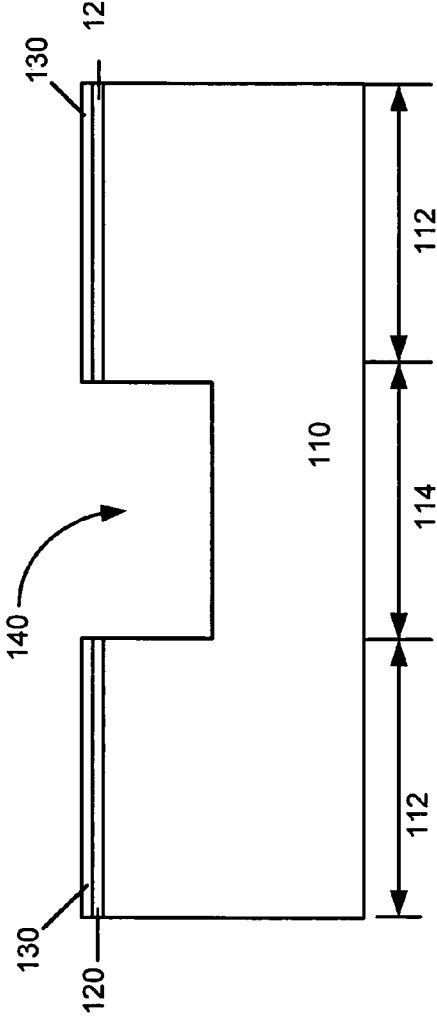

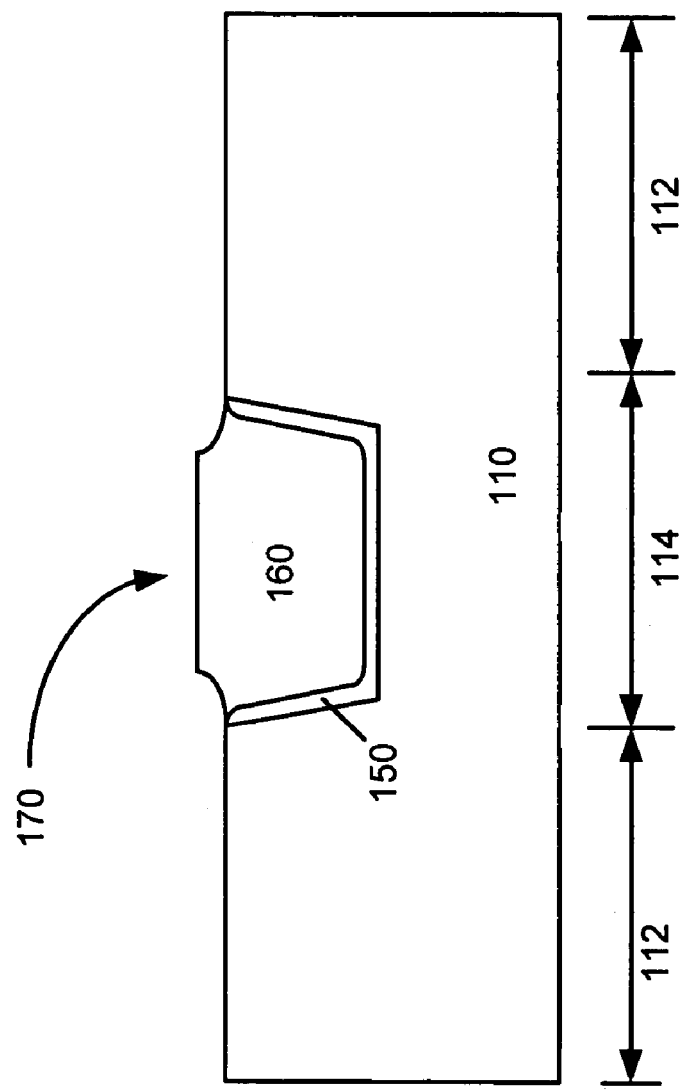

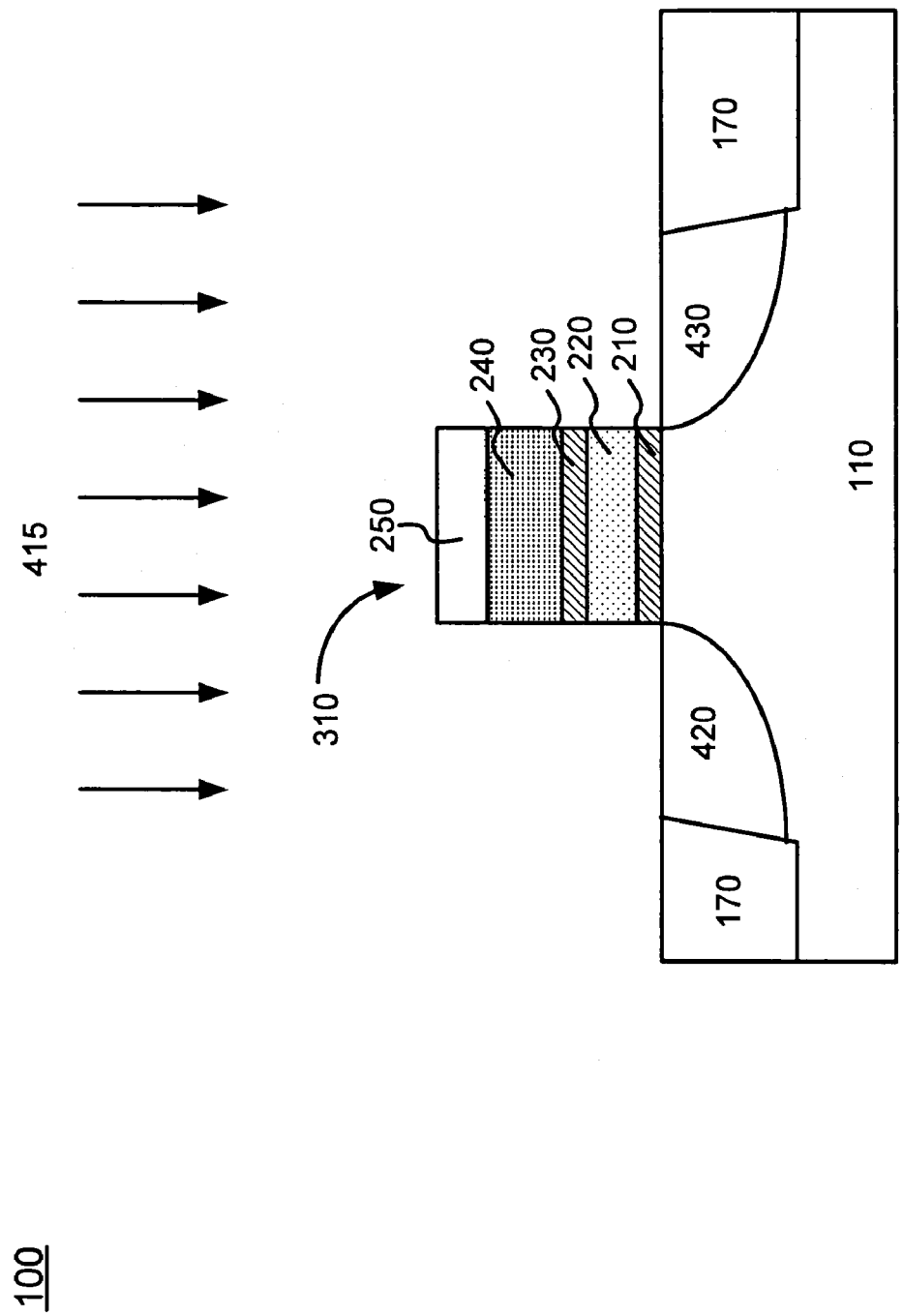

JUNCTION LEAKAGE SUPPRESSION IN MEMORY DEVICES

TECHNICAL FIELD

The present invention relates generally to semiconductor devices and methods of manufacturing semiconductor devices. The invention has particular applicability to memory devices and improving reliability for memory devices.

BACKGROUND ART

The escalating demands for high density and performance associated with non-volatile memory devices, such as electrically erasable programmable read only memory (EEPROM) devices, require small design features, high reliability and increased manufacturing throughput. The reduction of design features, however, challenges the limitations of conventional methodology.

One particular problem with non-volatile memory devices involves junction leakage. For example, leakage currents caused by carriers at the source and/or drain junctions may be injected into the charge storage element during write or erase operations. The junction leakage currents may make it difficult for the memory device to be efficiently programmed or erased. In addition, the junction leakage may also make it difficult for the memory device to meet the expected data retention requirement and, ultimately, may lead to device failure.

DISCLOSURE OF THE INVENTION

Implementations consistent with the invention reduce junction leakage by forming relatively deep source and/or drain junctions in the semiconductor substrate. The deep source/drain junctions may significantly reduce junction leakage.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one aspect consistent with the invention, a memory device is provided. The memory device includes a substrate, a source region formed in the substrate and a drain region formed in the substrate. The source and drain regions include phosphorous and arsenic. The memory device also includes a first dielectric layer formed over the substrate and a charge storage element formed over the first dielectric layer. The memory device further includes a second dielectric layer formed over the charge storage element and a control gate formed over the second dielectric layer.

According to another aspect consistent with the invention, a method of manufacturing a semiconductor device is provided. The method includes forming a memory cell, where the memory cell includes a tunnel oxide layer formed on a substrate, a charge storage element, an inter-gate dielectric and a control gate. The method also includes implanting phosphorous and arsenic in the substrate to form a source region and a drain region.

According to a further aspect consistent with the invention, a non-volatile memory device is provided. The non-volatile memory device includes a plurality of memory cells. Each memory cell includes a dielectric layer formed on a substrate, a charge storage element formed on the dielectric layer, an inter-gate dielectric formed on the charge storage element and a control gate formed over the inter-gate dielectric. The non-volatile memory device also includes a source region formed in the substrate, where the source region includes phosphorous and arsenic. The non-volatile memory device further includes a drain region formed in the substrate, where the drain region includes phosphorous and arsenic.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 1A-1D are cross-sections illustrating the formation of active and isolation regions in a semiconductor device in accordance with an embodiment of the invention.

FIGS. 4A and 4B are cross-sections illustrating the formation of source and drain regions in the device of FIG. 3 in accordance with an embodiment of the invention.

BEST MODE FOR CARRYING OUT THE INVENTION

Figure 1C:
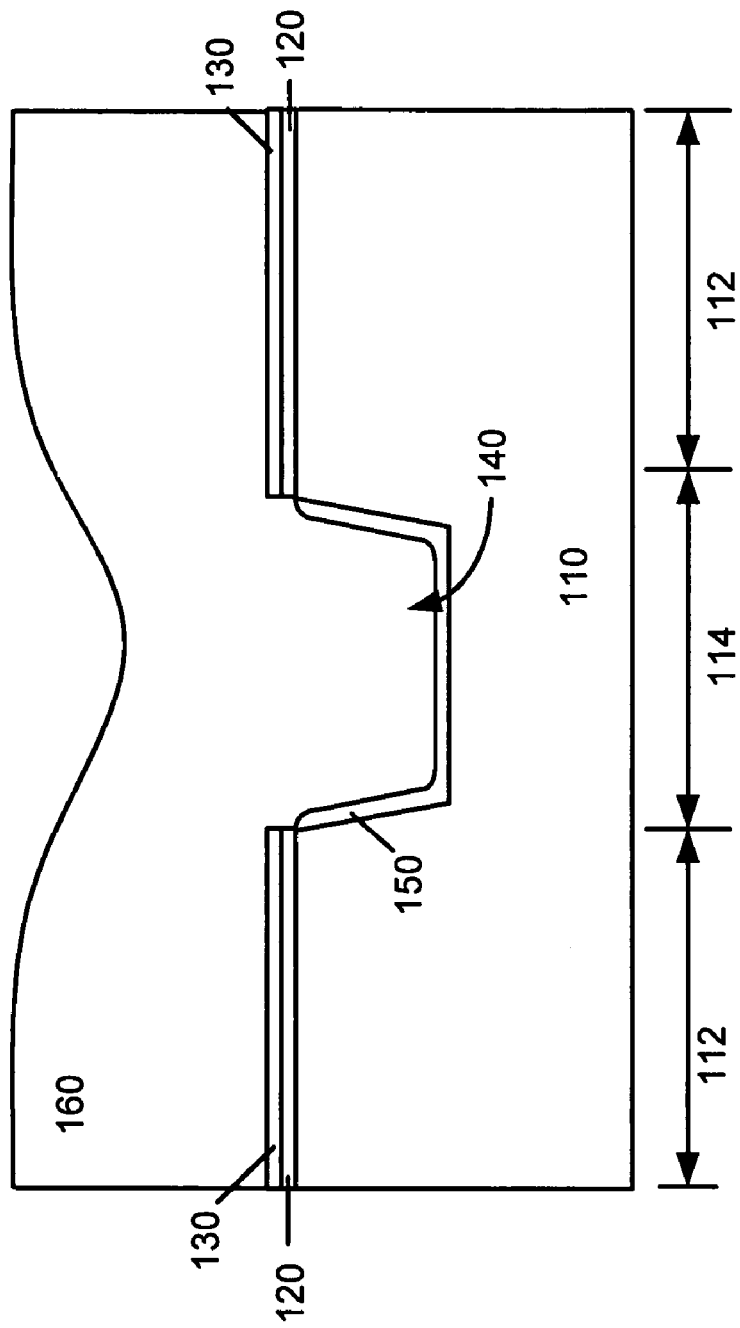

FIG. 1A is a cross-section illustrating the formation of active and isolation regions in a semiconductor device in accordance with an embodiment of the invention. Referring to FIG. 1A, semiconductor device 100 may include a semiconductor substrate 110 that will be divided into active regions 112 and an isolation region 114. Only two active regions 112 and a single isolation region 114 are shown in FIG. 1A for simplicity. It should be understood that semiconductor device 100 may include a large number of active regions 112 and isolation regions 114.

A relatively thin oxide layer 120 may be formed on substrate, followed by formation of a nitride layer 130, as illustrated in FIG. 1A. Masks (not shown) may be used to define the active regions 112. For example, masks may be formed over active regions 112 to protect active regions 112 during subsequent etching.

The portion of semiconductor device 100 not covered by the masks (e.g., isolation region 114) may be etched to form trench 140, as illustrated in FIG. 1B. Referring to FIG. 1B, trench 140 may be formed in substrate 110 to provide isolation between active regions 112 associated with subsequently formed memory cells. The depth of trench 140 may vary based on the particular circuit requirements.

An oxide layer 150 may be formed in trench 140, as illustrated in FIG. 1C. A dielectric layer 160 may then be deposited over semiconductor device 100, as also illustrated in FIG. 1C. Dielectric layer 160 may include, for example, an oxide, such as silicon dioxide. Dielectric layer 160, also referred to as field oxide 160, may fill trench 140.

Dielectric layer 160 may then be planarized. For example, a chemical-mechanical polishing (CMP) process may be performed to planarize dielectric layer 160 such that the upper surface of dielectric layer 160 is approximately even with the top surface of nitride layer 130. Nitride layer 130 and oxide layer 120 may then be removed, as illustrated in FIG. 1D. Referring to FIG. 1D, after nitride layer 130 and oxide layer 120 are removed, semiconductor device 100 includes region 170 formed in isolation region 114. Region 170, also referred to as shallow trench isolation (STI) region 170, includes trench 140 filled with oxide 150 and field oxide 160. STI region 170 may function to isolate active regions 112 in semiconductor device 100. For example, STI region 170 may isolate a source/drain region formed in one active region 112 that is associated with one memory cell from a source/drain region formed in another active region 112 associated with another memory cell.

Figure 2:
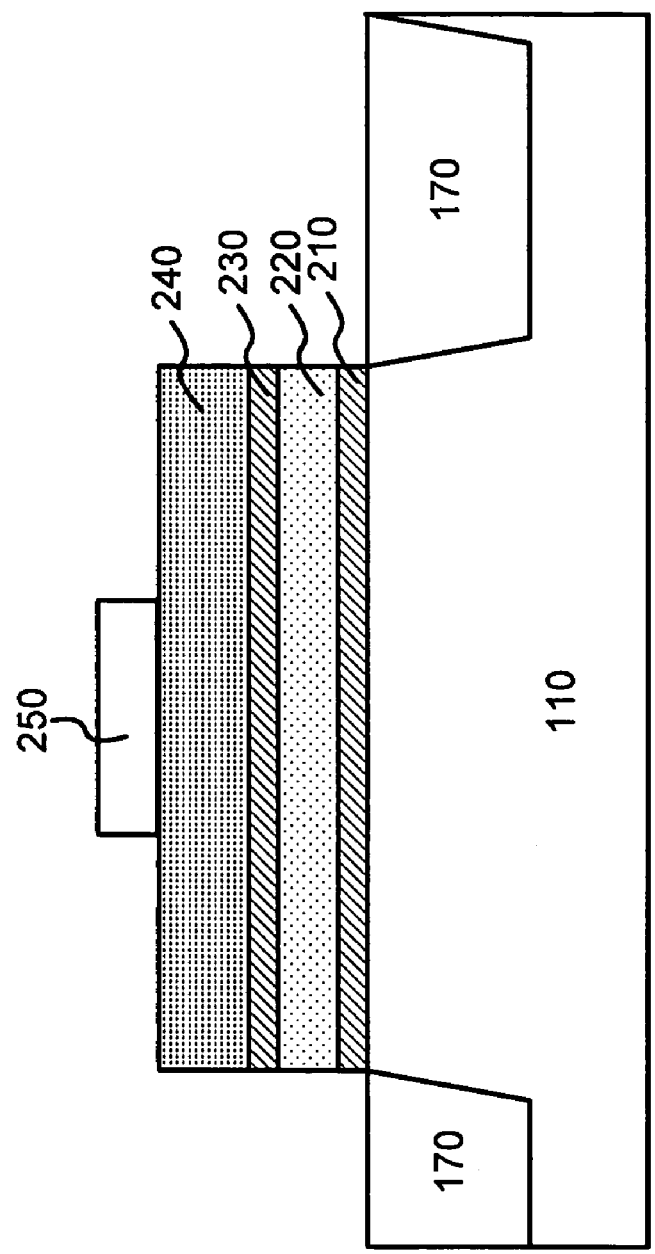
FIG. 2 is a cross-section illustrating exemplary layers used to form a memory cell in accordance with an embodiment of the invention.

One or more layers may then be formed on the active regions 112 of semiconductor device 100. For example, layers 210, 220, 230 and 240 may be formed on an active region 112 of substrate 110, as illustrated in FIG. 2. In an exemplary embodiment, substrate 110 may include silicon, germanium, silicon-germanium or other semiconducting materials. In an exemplary embodiment, substrate 110 may include single crystal silicon. The active regions of substrate 110 may be doped with p-type impurities, such as boron. Alternatively, the active regions of substrate 110 may be doped with n-type impurities, such as arsenic or phosphorous.

Layer 210 may be a dielectric layer formed on substrate 110 in a conventional manner. In an exemplary implementation, dielectric layer 210 may include an oxide, such as a silicon oxide (e.g., $SiO_2$), and may have a thickness ranging from about 50 angstroms (Å) to about 150 Å. Dielectric layer 210 may function as a tunnel oxide layer for a subsequently formed memory cell of semiconductor device 100.

Layer 220 may be formed on layer 210 in a conventional manner and may include a dielectric material, such as a nitride (e.g., a silicon nitride), an aluminum oxide or a silicon-rich oxide. Layer 220, consistent with the invention, may act as a charge storage layer for semiconductor device 100 and may have a thickness ranging from about 50 Å to about 200 Å. In alternative implementations, layer 220 may include a conductive material, such as polycrystalline silicon, used to form a floating gate electrode for semiconductor device 100. In this implementation, layer 220 may have a thickness ranging from about 400 Å to about 1000 Å.

Layer 230 may be formed on layer 220 in a conventional manner and may include a dielectric material, such as an oxide (e.g., $SiO_2$). Alternatively, layer 230 may include another material having a high dielectric constant (K), such as aluminum oxide or tantalum oxide, that may be deposited or thermally grown on layer 220. In still other alternatives, layer 230 may be a composite that includes a number of dielectric layers or films. Layer 230 may have a thickness ranging from about 50 Å to about 200 Å and may function as an inter-gate dielectric for one or more memory cells in semiconductor device 100.

Layer 240 may include a conductive material, such as polycrystalline silicon, formed on layer 230 in a conventional manner. Alternatively, layer 240 may include other semiconducting materials, such as germanium or silicon-germanium, or various metals, such as titanium or tungsten. Layer 240, consistent with the invention, may be used to form one or more control gate electrodes for one or more memory cells in semiconductor device 100. In an exemplary implementation, layer 240 may have a thickness ranging from about 500 Å to about 2,500 Å.

A photoresist material may be patterned and etched to form mask 250 on the top surface of layer 240, as illustrated in FIG. 2. Mask 250 may be used to facilitate formation of one or more memory cells in semiconductor device 100, as described in more detail below.

Figure 3:
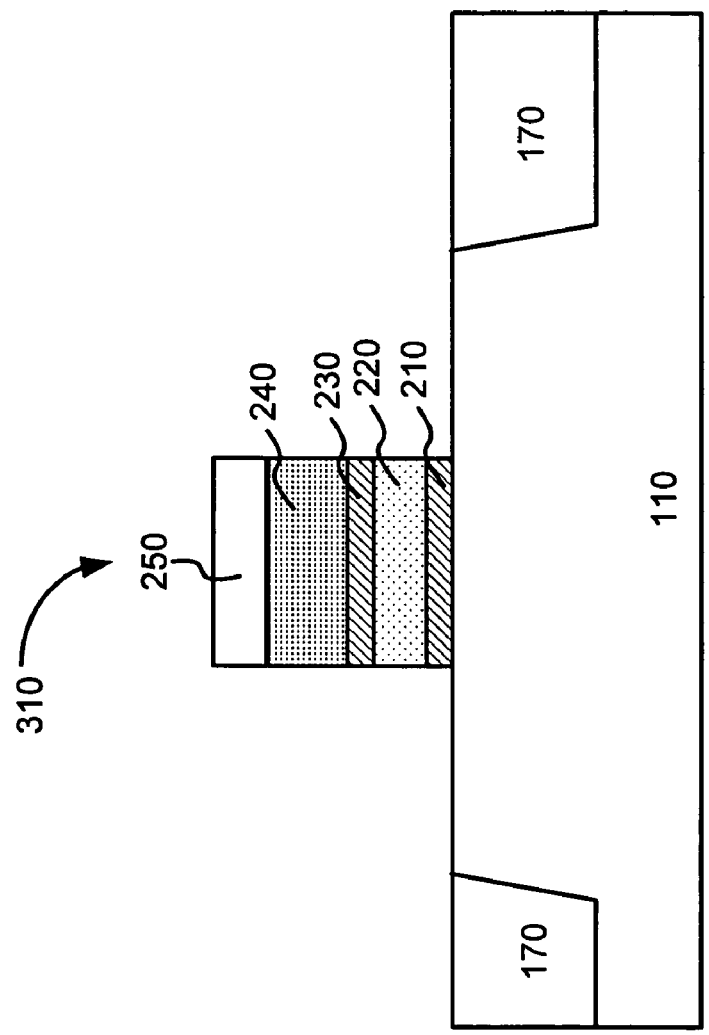
FIG. 3 is a cross-section illustrating the formation of a memory cell in accordance with an embodiment of the invention.

Semiconductor device 100 may then be etched. Referring to FIG. 3, layers 210-240 may be etched in a conventional manner with the etching terminating at substrate 110, thereby forming structure 310. Structure 310 (also referred to herein as a memory cell 310) may represent a memory cell of semiconductor device 100, where each memory cell 310 includes a dielectric layer 210, a charge storage layer 220, an inter-gate dielectric layer 230 and a control gate electrode 240. Only one memory cell 310 is illustrated in semiconductor device 100 in FIG. 3 for simplicity. It should be understood that semiconductor device 100 may typically include a memory array including a large number of memory cells 310.

In an exemplary implementation consistent with the invention, memory cell 310 may be a SONOS-type memory cell, with a silicon control gate electrode 240 formed on an oxide-nitride-oxide (ONO) stack (i.e., layers 230, 220 and 210), with nitride layer 220 acting as a charge storage layer, and the ONO stack being formed on a silicon substrate 110. In alternative implementations, memory cell 310 may be a floating gate memory cell, with a silicon control gate electrode 240, an inter-gate dielectric 230, a polysilicon floating gate electrode 220 and a tunnel oxide layer 210 formed on substrate 110.

Source and drain regions may then be formed in substrate 110. For example, n-type or p-type impurities may be implanted in substrate 110 to form source and drain regions based on the particular end device requirements. In an exemplary embodiment of the invention in which substrate 110 is doped with p-type impurities, the subsequently formed source and drain regions may be n-type regions. In this embodiment, the formation of source and drain regions may include a two step implantation processes.

Figure 4A:
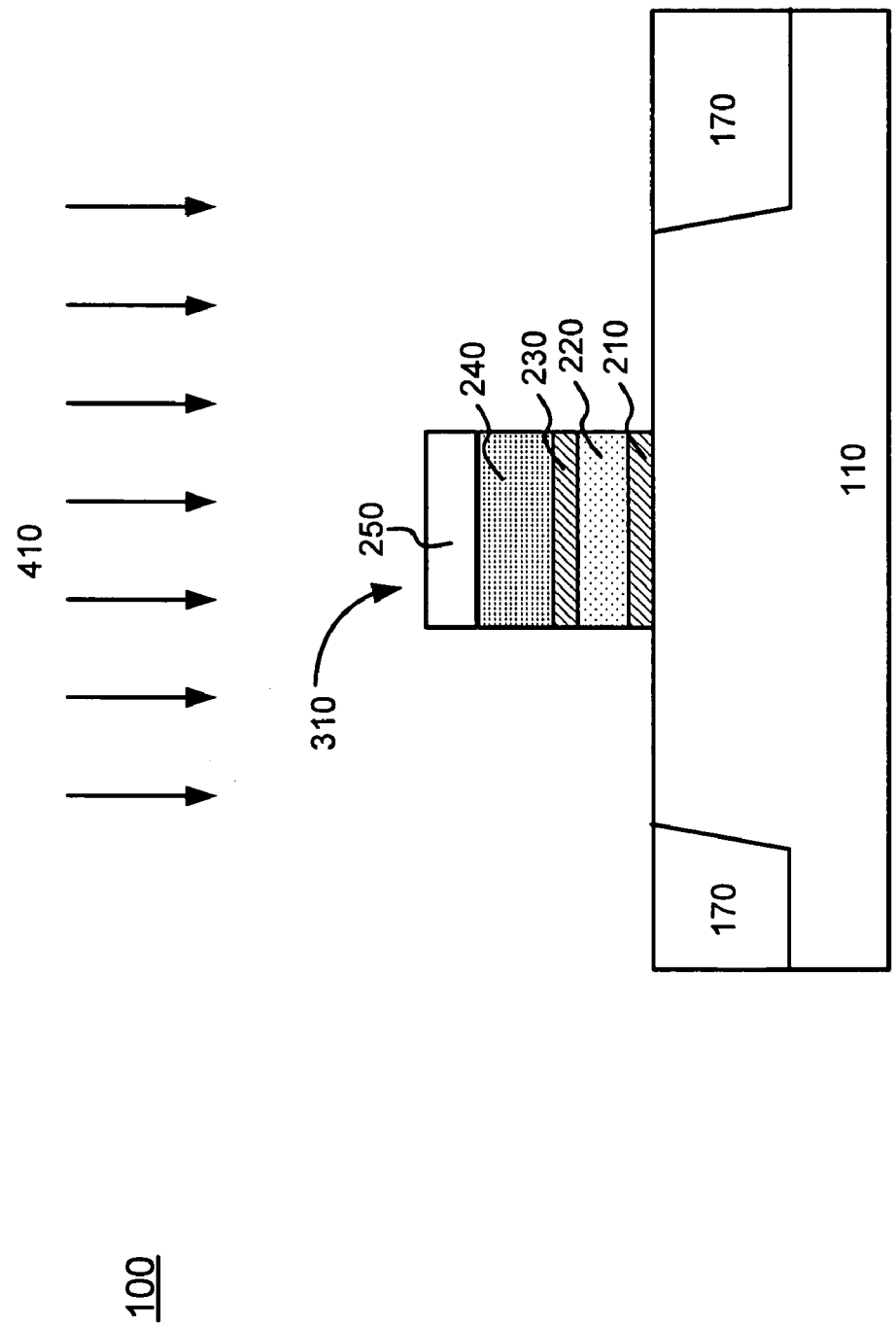

For example, an n-type dopant, such as phosphorous, may be implanted in substrate 110, as illustrated by arrows 410 in FIG. 4A. In an exemplary embodiment, the phosphorous may be implanted at a dosage ranging from about $4 \times 10^{13}$ atoms/cm$^2$ to about $3 \times 10^{14}$ atoms/cm$^2$ and an implantation energy ranging from about 50 KeV to about 70 KeV. It has been found that implanting phosphorous at these dosages and energies into substrate 110, which may be a single crystal silicon substrate 110, results in the phosphorous moving relatively deeply into substrate 110, thereby enabling deep source/drain junctions to be formed. For example, the phosphorous may be implanted into substrate 110 to a depth ranging from about 1,000 Å to about 2,500 Å below the upper surface of substrate 110. Thus, the phosphorous essentially act as a co-implant to enable the formation of relatively deep junctions in substrate 110.

After the phosphorous is implanted, a second implantation may be performed as indicated by arrows 415 in FIG. 4B. In this second implantation, arsenic may be implanted at a dosage ranging from about $1 \times 10^{15}$ atoms/cm$^2$ to about $5 \times 10^{15}$ atoms/cm$^2$ and an implantation energy ranging from about 30 KeV to about 70 KeV to form source region 420 and drain region 430, as illustrated in FIG. 4B. In this second implantation, the arsenic may be implanted into substrate 110 to a depth ranging from about 500 Å to about 1,500 Å below the upper surface of substrate 110.

It has been found that implanting arsenic after the phosphorous enables the source/drain regions 420 and 430 to have relatively deep junctions in substrate 110. That is, the junction where the n-type source/drain region 420 and 430 meets the p-type substrate 110 is formed at a relatively deep depth below the upper surface of substrate 110. In an exemplary implementation, the source/drain junctions may be formed at a depth ranging from about 1,000 Å to about 2,500 Å below the upper surface of substrate 110.

The particular implantation dosages and energy used to form source and drain regions 420 and 430 discussed above are exemplary only and the dosages and energies may be selected based on the particular end device requirements. One of ordinary skill in the art would be able to optimize the source/drain implantation process based on the particular circuit requirements. It should also be understood that source region 420 and drain region 430 may alternatively be formed at other points in the fabrication process of semiconductor device 100. For example, sidewall spacers may be formed prior to the source/drain ion implantation to control the location of the source/drain junctions based on the particular circuit requirements.

In each case, the phosphorous is implanted prior to the arsenic to allow deeper source/drain junctions in substrate 110. If the arsenic is implanted prior to the phosphorous, it has been found that substrate 110 may become amorphous. The subsequently deposited phosphorous may then be unable to reach the desired junction depth into substrate 110.

Figure 5:
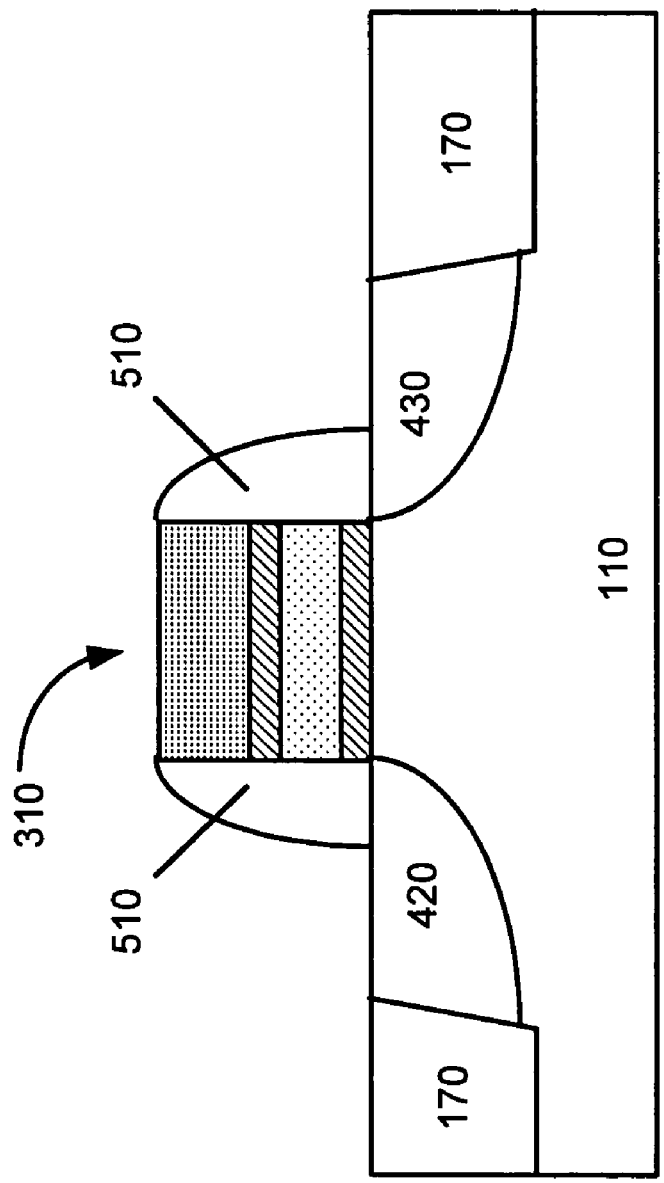
FIG. 5 is a cross-section illustrating the formation of spacers on the device of FIG. 4B in accordance with an embodiment of the invention.

Photoresist mask 250 may be removed using a conventional process. Spacers 510 may be formed adjacent the sidewalls of the memory cell 310, as illustrated in FIG. 5. For example, a dielectric material, such as a silicon oxide, a silicon oxynitride or another dielectric material, may be deposited and etched to form spacers 510 on each side of memory cell 310, as illustrated in FIG. 5. Spacers 510 may be used to electrically isolate one memory cell 310 from an adjacent memory cell 310. Spacers 510 may also be used to facilitate the deposition of additional impurities in semiconductor device 100.

Figure 6:
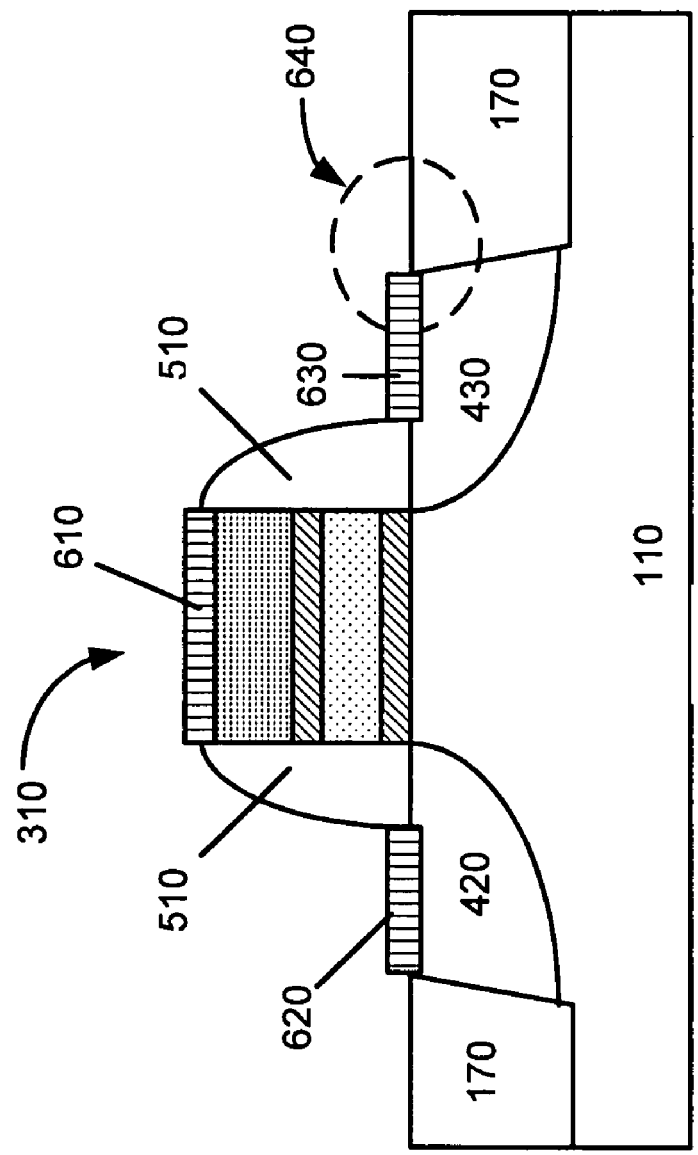
FIG. 6 is a cross-section illustrating the formation of a silicide layer on portions of the semiconductor device of FIG. 5 in accordance with an embodiment of the invention.

A metal layer, such as cobalt or titanium, may be deposited over semiconductor device 100. Semiconductor device 100 may then be annealed to react the deposited metal with the exposed silicon on semiconductor device 100 to form a metal-silicide compound (also referred to herein as a silicide). For example, referring to FIG. 6, a silicide layer 610 may be formed over control gate 240. Silicide layers 620 and 630 may also be formed over source region 420 and drain region 430, respectively, as illustrated in FIG. 6. The unreacted metal, such as unreacted metal deposited over spacers 510 and STI regions 170, may then be removed. In an exemplary embodiment, silicide layers 610, 620 and 630 may be cobalt silicide (e.g., CoSi$_2$). In other embodiments, silicide layers 610-630 may be titanium silicide (e.g., TiSi$_2$).

In an exemplary embodiment, silicide layers 620 and 630 located near STI regions 170 may extend more deeply into the portion of source/drain regions 420 and 430 located near the STI region 170 than the portion of source/drain regions 420 and 430 located closer to spacers 510. For example, region 640, illustrated by the dotted lines in FIG. 6, may include silicide layer 630 that extends more deeply into a portion of drain region 430 located adjacent STI region 170, as discussed in more detail below.

Figure 7:
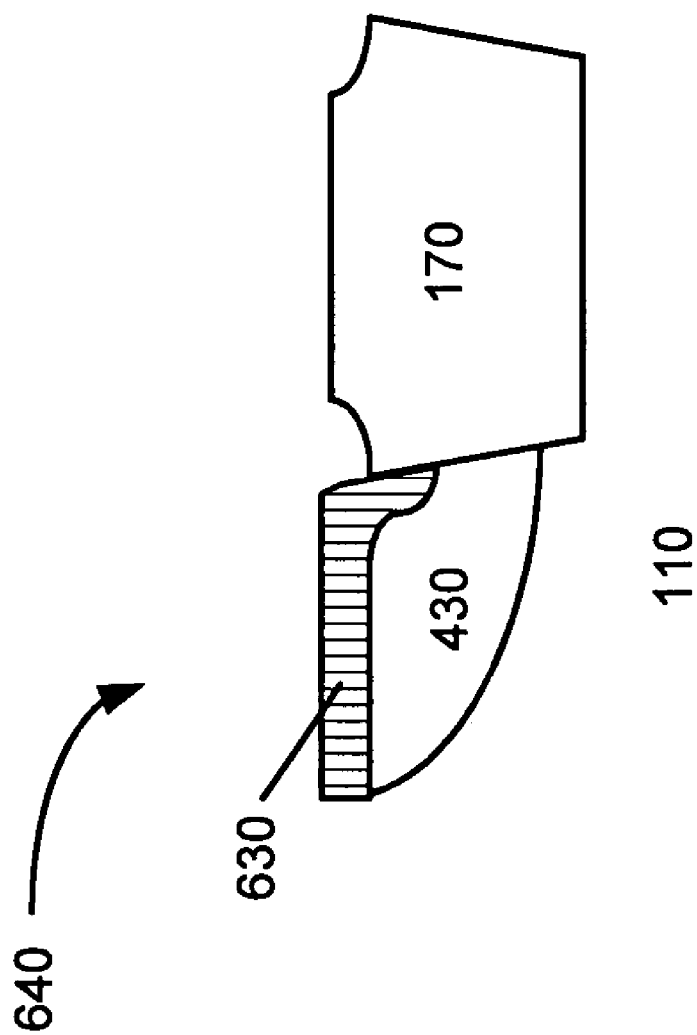
FIG. 7 is a cross-section illustrating a portion of the semiconductor device of FIG. 6 in accordance with an embodiment of the invention.

FIG. 7 illustrates region 640 in more detail. Referring to FIG. 7, region 640 includes silicide layer 630 formed over drain region 430 and adjacent STI region 170. As illustrated, silicide layer 630 extends over most of the entire upper portion of drain region 430 to a first depth. Silicide layer 630, however, extends more deeply into drain region 430 at the portion of drain region 430 located adjacent STI region 170, as illustrated in FIG. 7. This deeper incursion of silicide layer 630 into the portion of drain region 430 adjacent STI region 170 may be caused by a lower portion of drain region 430 (i.e., a portion of drain region 430 located further below the upper surface of substrate 110) being exposed as a result of the formation of STI region 170. Therefore, silicide layer 630 may extend to a relatively deep depth into the portion of drain region 430 located adjacent STI region 170.

A similar incursion of silicide layer 620 into source region 420 may occur at the portion of source region 420 adjacent the corresponding STI region 170. Due to the implantation process described above to form source region 420 and drain region 430, however, silicide layer 620 does not reach the junction of source region 420 and substrate 110. Similarly, silicide layer 630 does not reach the junction of drain region 430 and substrate 110. For example, as discussed above, the implantation of phosphorous prior to the arsenic enables the source/drain junctions to be formed more deeply into substrate 110 than if just arsenic or phosphorous were used or if arsenic was implanted prior to phosphorous. Advantageously, the deep source/drain junctions prevent leakage currents from being generated at the source/drain junctions near STI regions 170. In addition, the portion of silicide layers 620 and 630 formed closer to the channel of memory cell 310 do not cause junction leakage since the source/drain junctions near the channel of memory cell 310 are much deeper than silicide layers 620 and 630. Therefore, forming source and drain regions 420 and 430 in the manner described above eliminates or significantly reduces junction leakage.

Figure 8:
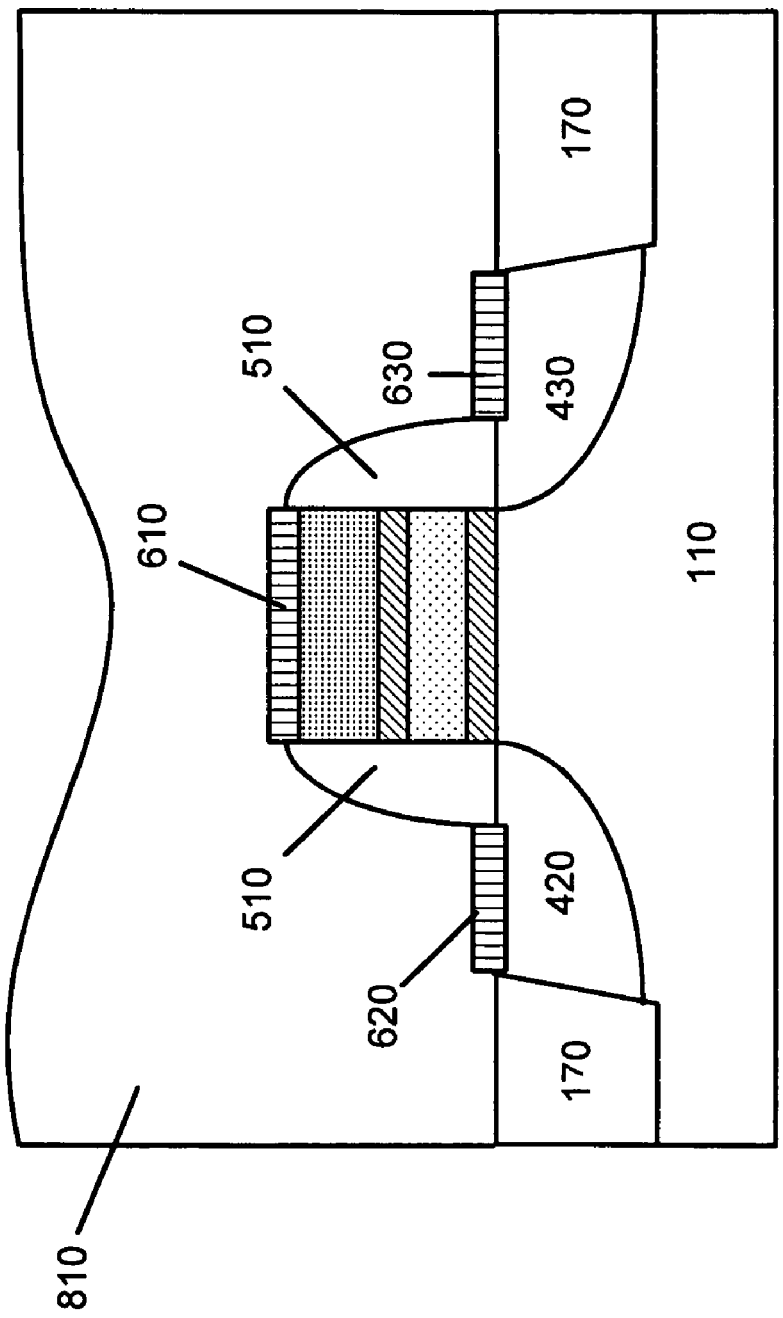
FIG. 8 is a cross-section illustrating the formation of an interlayer dielectric on the device of FIG. 4 in accordance with an embodiment of the invention.

An interlayer dielectric (ILD) 810 may be formed on semiconductor device 100, as illustrated in FIG. 8. In an exemplary implementation, ILD layer 810 may include an oxide, such as silicon dioxide, a phosphosilicate glass (PSG), a boro-phosphosilicate glass (BPSG), etc. The thickness of ILD 810 may range from about 8,000 Å to about 15,000 Å.

Figure 9:
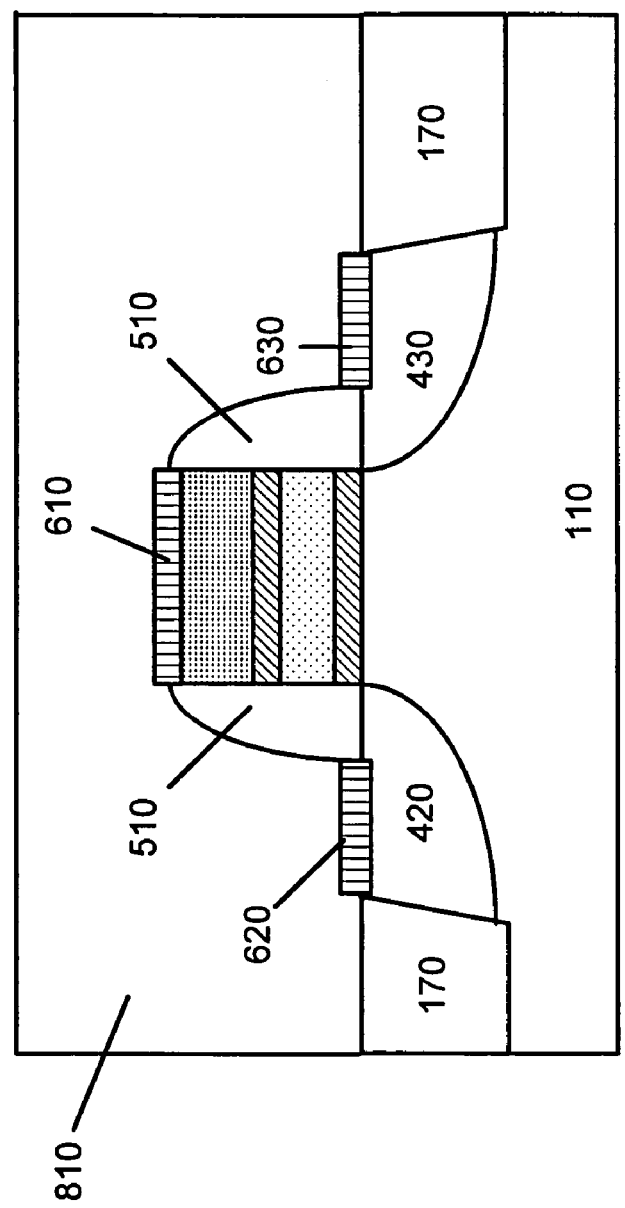
FIG. 9 is a cross-section illustrating the planarization of the interlayer dielectric of FIG. 8 in accordance with an embodiment of the invention.

ILD 810 may optionally be planarized using a conventional process, such as a chemical-mechanical polishing (CMP) process, as illustrated in FIG. 9. Referring to FIG. 9, the CMP process may planarize the top surface of ILD 810 to facilitate formation of subsequent structures, such as interconnect lines. ILD 810, consistent with the invention, may represent an ILD located closest to substrate 110 and may function to isolate various conductive structures, such as various interconnect lines (not shown), source region 420 or drain region 430 from an external electrode (not shown), etc.

For example, a trench (not shown) may subsequently be formed in ILD 810 using conventional photolithographic and etching technique. The trench may be used to form a contact to, for example, source region 420 or drain region 430. Next, a metal layer, such as copper or aluminum, may be deposited to fill the trench. An interconnect line (not shown) may then be formed over the planarized top surface of ILD 810 in FIG. 9. For example, a metal, such as copper or aluminum, may be deposited to form an interconnect that connects various features in semiconductor device 100, such as source or drain regions 420/430 to an external electrode, to facilitate programming or erasing various memory cells 310 in semiconductor device 100.

In an exemplary implementation consistent with the invention, memory cell 310 illustrated in FIG. 9 may be configured to store two bits of data. That is, charge storage layer 220 may be programmed to store two separate bits of data by localizing the first and second charges to the respective left and right sides of charge storage layer 220 illustrated in FIG. 6. For example, each of the two bits of memory cell 310 may be programmed independently by, for example, channel hot electron injection, to store a bit on each respective side of the charge storage layer 220. In this manner, the charges in charge storage layer 220 become effectively trapped on each respective side of charge storage layer 220. Erasing of each bit in memory cell 310 may also be performed independently. During erasing, the bits stored in charge storage layer 220 may tunnel through dielectric layer 210 into the source region 420 and drain region 430, respectively.

In this manner, the density of the resulting memory array in semiconductor device 100 may be increased as compared to conventional memory devices that store only one bit of data per cell. In alternative implementations, each memory cell 310 may be configured to store one bit of data per memory cell 310. In each case, forming deep source/drain junctions prevents or substantially reduces junction leakage in semiconductor device 100.

In summary, implementations consistent with the invention use a two step implantation process to form relatively deep source and drain regions 420 and 430 to reduce or eliminate junction leakage at the source/drain junctions. Advantageously, the memory cells 310 in semiconductor device 100 may exhibit increased reliability.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of chemical vapor deposition (CVD) processes, including low pressure chemical vapor deposition (LPCVD) and enhanced chemical vapor deposition (ECVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A memory device, comprising:
   a substrate;
   a source region formed in the substrate, the source region comprising phosphorous and arsenic, where the phosphorous in the source region is formed to a depth ranging from about 2,000 Å to about 2,500 Å below an upper surface of the substrate and the arsenic in the source region is formed to a depth ranging from about 1,000 Å to about 1,500 Å below the upper surface of the substrate, and the phosphorous in the source region is formed to a greater depth below the upper surface of the substrate than the arsenic in the source region, where the source region has a greatest width at an upper portion that is adjacent the upper surface of the substrate, and a smallest width at a deepest portion with respect to the upper surface of the substrate, and where the deepest portion of the source region includes only the phosphorous and the upper portion of the source region includes a combination of the phosphorous and the arsenic, and where the deepest portion of the source region has a smaller width than the upper portion;
   a drain region formed in the substrate, the drain region comprising phosphorous and arsenic, where the phosphorous in the drain region is formed to a depth ranging from about 1,000 Å to about 2,500 Å below the upper surface of the substrate and the arsenic in the drain region is formed to a depth ranging from about 500 Å to about 1,500 Å below the upper surface of the substrate, and the phosphorous in the drain region is formed to a greater depth below the upper surface of the substrate than the arsenic in the drain region, where the drain region has a greatest width at an upper portion that is adjacent the upper surface of the substrate and a smallest width at a deepest portion with respect to the upper surface of the substrate, and where the deepest portion of the drain region includes only the phosphorous and the upper portion of the drain region includes a combination of the phosphorous and the arsenic, and where the deepest portion of the drain region has a smaller width than the upper portion;
   a first dielectric layer formed over the substrate;
   a charge storage element formed over the first dielectric layer;
   a second dielectric layer formed over the charge storage element;
   a control gate formed over the second dielectric layer;
   a first isolation region located adjacent to the deepest portion of the source region, the deepest portion of the source region preventing leakage currents from being generated at the junction near the first isolation region, where the first isolation region comprises an oxide and a field oxide;
   a first silicide layer formed over the source region, the first silicide layer wrapping around and extending to a greater depth, into the source region, in an area adjacent to the first isolation region than in other areas of the source region, where the area adjacent to the first isolation region is smaller than the other areas of the source region;

a second isolation region located adjacent to the deepest portion of the drain region, the deepest portion of the drain region preventing leakage currents from being generated at the junction near the second isolation region, where the second isolation region comprises an oxide and a field oxide; and a second silicide layer formed over the drain region, the second silicide layer wrapping around and extending to a greater depth, into the drain region, in an area adjacent to the second isolation region than in other areas of the drain region, where the area adjacent to the second isolation region is smaller than the other areas of the drain region.

2. The memory device of claim 1, where the phosphorous in the source and drain regions is implanted before the arsenic.

3. The memory device of claim 1, where the phosphorous is implanted in the source and drain regions prior to the arsenic at a dosage ranging from about $1 \times 10^{14}$ atoms/cm$^2$ to about $3 \times 10^{14}$ atoms/cm$^2$ and an implantation energy ranging from 60 KeV to about 70 KeV.

4. The memory device of claim 3, where the arsenic is implanted at a dosage ranging from about $1 \times 10^{15}$ atoms/cm$^2$ to about $5 \times 10^{15}$ atoms/cm$^2$ and an implantation energy ranging from about 30 KeV to about 70 KeV.

5. The memory device of claim 1, where the charge storage element comprises a nitride.

6. A method of manufacturing a semiconductor device, comprising:

forming a memory cell, the memory cell including a tunnel oxide layer formed on a substrate, a charge storage element, an inter-gate dielectric and a control gate;

implanting phosphorous and arsenic in the substrate to form a source region and a drain region, where the phosphorous is implanted to a depth ranging from about 2,000 Å to about 2,500 Å below an upper surface of the substrate and is implanted at a dosage ranging from $6 \times 10^{13}$ atoms/cm$^2$ to about $3 \times 10^{14}$ atoms/cm$^2$ and the arsenic is implanted to a depth ranging from about 1,000 Å to about 1,500 Å below the upper surface of the substrate, and the phosphorous is implanted to a greater depth below the upper surface of the substrate than the arsenic before implanting the arsenic, where a deepest portion of the source region includes only phosphorous and prevents leakage currents from being generated at a junction near a first isolation region and a deepest portion of the drain region includes only phosphorous and prevents leakage currents from being generated at a junction near a second isolation region;

forming the first isolation region adjacent to the source region from a combination of an oxide and a field oxide;

forming one first silicide layer over the source region, the first silicide layer wrapping around and extending to a greater depth, into the source region, in an area adjacent to the first isolation region than in other areas of the source region, where the area adjacent to the first isolation region is smaller than the other areas of the source region;

forming the second isolation region adjacent to the drain region from a combination of the oxide and the field oxide; and forming a second silicide layer over the drain region during an annealing process, the second silicide layer wrapping around and extending to a greater depth, into the drain region, in an area adjacent to the second isolation region than in other areas of the drain region, where the area adjacent to the second isolation region is smaller than the other areas of the drain region.

7. The method of claim 6, where the phosphorous is implanted at an implantation energy ranging from about 50 KeV to about 70 KeV.

8. The method of claim 7, where the arsenic is implanted at a dosage ranging from about $1 \times 10^{15}$ atoms/cm$^2$ to about $5 \times 10^{15}$ atoms/cm$^2$ and an implantation energy ranging from about 30 KeV to about 70 KeV.

9. A non-volatile memory device, comprising:

a plurality of memory cells, each of the memory cells including:

a dielectric layer formed on a substrate, a charge storage element formed on the dielectric layer, an inter-gate dielectric formed on the charge storage element, a control gate formed over the inter-gate dielectric, a source region formed in the substrate having one location deeper than another location in the substrate, the source region comprising phosphorous and arsenic, a drain region formed in the substrate having one location deeper than another location in the substrate, the drain region comprising phosphorous and arsenic, where the phosphorous in the source and drain regions is implanted to a depth ranging from about 1,000 Å to about 2,500 Å below an upper surface of the substrate and the arsenic in the source and drain regions is implanted to a depth ranging from about 500 Å to about 1,500 Å below the upper surface of the substrate, where the phosphorous in the source and drain regions is implanted to a greater depth below the upper surface of the substrate than the arsenic in the source and drain regions, a first isolation region located adjacent to a deepest location of the source region, the deepest location of the source region preventing leakage currents from being generated at the junction near the first isolation region, where the first isolation region comprises a combination of an oxide and a field oxide;

a first silicide layer formed over the source region, the first silicide layer wrapping around and extending to a greater depth, into the source region, in an area adjacent to the first isolation region than in other areas of the source region, where the area adjacent to the first isolation region is smaller than the other areas of the source region;

a second isolation region located adjacent to a deepest location of the drain region, the deepest location of the drain region preventing leakage currents from being generated at the junction near the second isolation region, where the second isolation region comprises a combination of the oxide and the field oxide; and a second silicide layer formed over the drain region, the second silicide layer wrapping around and extending to a greater depth, into the drain region, in an area adjacent to the second isolation region than in other areas of the drain region, where the area adjacent to the second isolation region is smaller than the other areas of the drain region.

10. The non-volatile memory device of claim 9, where the phosphorous in the source and drain regions is implanted before the arsenic.

11. The non-volatile memory device of claim 10, where the phosphorous is implanted in the source and drain regions at a dosage ranging from about $6 \times 10^{13}$ atoms/cm$^2$ to about $3\times10^{14}$ atoms/cm$^2$ and an implantation energy ranging from about 50 KeV to about 70 KeV.

12. The non-volatile memory device of claim 11, where the arsenic is implanted in the source and drain regions at a dosage ranging from about $1\times10^{15}$ atoms/cm$^2$ to about $5\times10^{15}$ atoms/cm$^2$ and an implantation energy ranging from about 30 KeV to about 70 KeV.

13. The non-volatile memory device of claim 9, where the first and second silicide layers comprise cobalt silicide.

14. The method of claim 6, where implanting the phosphorous and the arsenic to form the source region and the drain region comprises:
   forming the source region having a greatest width at an upper portion that is adjacent the upper surface of the substrate and a smallest width at a deepest portion of the source region, where the deepest portion of the source region includes the phosphorous and none of the arsenic, the upper portion of the source region includes a combination of the phosphorous and the arsenic, and the deepest portion of the source region has a smaller width than the upper portion of the source region, and
   forming a drain region having a greatest width at an upper portion that is adjacent the upper surface of the substrate and a smallest width at a deepest portion of the drain region, where the deepest portion of the drain region includes the phosphorous and none of the arsenic, the upper portion of the drain region includes a combination of the phosphorous and the arsenic, and the deepest portion of the drain region has a smaller width than the upper portion of the drain region.

15. The non-volatile memory device of claim 9, where the source region has a greatest width adjacent the upper surface of the substrate and a smallest width at the deepest location with respect to the upper surface of the substrate,
   where the drain region has a greatest width adjacent the upper surface of the substrate and a smallest width at the deepest location with respect to the upper surface of the substrate, and
   where deeper portions of the source and drain regions include the phosphorous and none of the arsenic, and upper portions of the source and drain regions include a combination of phosphorous and arsenic.

16. The memory device of claim 1, where the charge storage element is programmed to concurrently store two separate bits of data.

17. The method of claim 6, further comprising:
   programming the charge storage element to concurrently store two bits of data.

18. The non-volatile memory device of claim 9, where the charge storage element is programmed to concurrently store two bits of data.

* * * * *